US005693363A

United States Patent [19]

Kuroda et al.

[11] Patent Number: 5,693,363

[45] Date of Patent: Dec. 2, 1997

[54] METHOD FOR PRODUCING AN ANODE FOR AN X-RAY TUBE USING CHEMICAL VAPOR DEPOSITION

[75] Inventors: Shinichi Kuroda, Osaka; Masahiro Hiraishi; Keiichi Yamanishi, both of Kyoto, all of Japan

[73] Assignee: Shimadzu Corporation, Kyoto, Japan

[21] Appl. No.: 547,546

[22] Filed: Oct. 24, 1995

[30] Foreign Application Priority Data

Oct. 28, 1994 [JP] Japan .................................... 6-265757

[51] Int. Cl.$^{6}$ ...................................................... C23C 16/06

[52] U.S. Cl. ......................... 427/78; 427/124; 427/248.1; 427/250; 427/160; 427/282; 427/267; 378/143

[58] Field of Search .............................. 427/78, 124, 160, 427/248.1, 250, 367, 282; 378/143, 144

[56] References Cited

U.S. PATENT DOCUMENTS

| | | | |
|---|---|---|---|
| 3,887,723 | 6/1975 | Kaplan et al. | 427/58 |
| 4,185,365 | 1/1980 | Hueschen et al. | 29/25.15 |
| 4,400,824 | 8/1983 | Shidara | 378/141 |
| 4,920,012 | 4/1990 | Woodruff et al. | 428/634 |
| 4,939,762 | 7/1990 | Baba et al. | 318/144 |

FOREIGN PATENT DOCUMENTS

| | | |
|---|---|---|
| 0 578 109 | 1/1994 | European Pat. Off. . |
| 2 566 961 | 1/1986 | France . |
| 1 006 083 | 4/1957 | Germany . |
| 62-97240 | 5/1987 | Japan . |

OTHER PUBLICATIONS

Patent Abstracts of Japan, vol. 001 No. 304 (E-545), 3 Oct. 1987, & JP-A-62 097240 (Toshiba Corp) 6 May 1987.

*Primary Examiner*—Shrive Beck
*Assistant Examiner*—Timothy Meeks
*Attorney, Agent, or Firm*—Nikaido, Marmelstein, Murray & Oram LLP

[57] ABSTRACT

This invention relates to an anode for use in an X-ray tube and a method of manufacturing the anode, and to a stationary anode X-ray tube. An anode base formed of copper or the like includes a recess formed in an end surface thereof and having an upwardly diverging inner peripheral wall. An anode target material such as tungsten is directly deposited in the recess by chemical vapor deposition.

4 Claims, 5 Drawing Sheets

METHOD FOR PRODUCING AN ANODE FOR AN X-RAY TUBE USING CHEMICAL VAPOR DEPOSITION

BACKGROUND OF THE INVENTION

1. Field of the Invention

This invention relates to an X-ray tube having a stationary anode (hereinafter referred to as a stationary anode X-ray tube), and more particularly to an anode for use in the stationary anode X-ray tube and a method of manufacturing the anode, and to the stationary anode X-ray tube.

2. Description of the Related Art

A stationary anode X-ray tube has no anode revolving mechanism as included in a revolving anode X-ray tube, and therefore has a relatively large heat capacity for its small size. Generally, X-ray tubes are used for medical purposes such as radiographic diagnosis. In surgical operations, however, stationary anode X-ray tubes are used since they are small and light, and hence convenient for transport.

Electrical energy is supplied to a target in order to produce X rays, but only 1% of the electrical energy is converted into X-ray energy. The remaining 99% is converted into undesirable heat which brings about a marked temperature increase of the target. Generally, an anode in a stationary anode X-ray tube includes a cylindrical copper anode base having high heat conductivity, and a disk-shaped anode target embedded in an inclined surface at one end of the anode base.

Two methods have been practiced heretofore for manufacturing such anodes. These are "casting method" and "brazing method". FIG. 1 shows a section of an anode manufactured by the casting method. FIG. 2 shows a section of an anode manufactured by the brazing method.

In the Casting Method, an anode target 2 formed of molybdenum (Mo) or tungsten (W) is placed in the bottom of an anode base forming crucible. Then, molten copper is poured into the crucible to form an anode base 1. In this way, the target 2 and base 1 are integrated.

In the Brazing Method, an anode base 1 is prepared in advance, with a recess 3 formed in an inclined surface thereof for receiving an anode target 2. Then, an appropriate solder 4 is applied to the bottom surface of recess 3, and the target 2 is fitted in the recess 3. Subsequently, the anode is heated to join the target 2 to the base 1 through the solder 4.

The above conventional methods have the following drawbacks.

In the Casting Method, copper to form the anode base 1 is heated above its melting point by high frequency heating, with a burner, or the like. This process requires a large amount of energy and results in high cost. Further, this method needs a crucible and the like for forming the anode base 1, and these devices have poor durability which increase the cost of anode base manufacturing. Moreover, the worst drawback of this method is that the cohesion between base 1 and target 2 is weak and unstable, resulting in low heat conductivity. This is due to a low degree of metal-to-metal conformability between base 1 formed of copper and target 2 formed of a metal of high melting point (e.g. tungsten). That is, copper and tungsten, essentially, have low wettability, and do not form an alloy layer when combined together. With an X-ray tube prepared in such a condition, a slight overload causes cracks or fusion in the target surface, and in an extreme case peeling of the target.

In the Brazing Method, bubbles are formed between target 2 and base 1 at the time of brazing. These bubbles are mainly responsible for peeling of the target under the thermal stress of repeated load or for cracks or fusion in the target surface due to reduced heat conductivity. Further, the melting point of the solder essentially determines the maximum use temperature of the anode, which results in a lower critical use temperature than where target 2 and base 1 are directly joined together. In addition, a low withstanding voltage is caused by impurities having mixed into gaps between target 2 and base 1 or by a field concentration occurring in such gaps.

SUMMARY OF THE INVENTION

This invention intends to provide an anode for an X-ray tube, a method of manufacturing the anode, and a stationary anode X-ray tube, which eliminate the drawbacks noted above.

The above object is fulfilled, in one aspect of this invention, by an anode for use in a stationary anode X-ray tube, comprising:

an anode base with a recess formed in an end surface thereof and having an upwardly diverging inner peripheral wall; and an anode target formed in the recess by directly fixing therein an anode target material by chemical vapor deposition (CVD).

According to this invention, an anode target is formed by directly fixing an anode target material by chemical vapor deposition in a recess formed in an end surface of an anode base. The target thus formed has strong adherence to the anode base. Consequently, heat conductivity from the target to the anode base is enhanced, and the target is highly durable against intense thermal loads.

In the case of an anode for an X-ray tube obtained by the conventional "casting method" or "brazing method", as shown in FIGS. 1 and 2, an end surface of anode base 1 must define a recess (which may inevitably be formed) for embedding the target 2. However, where the anode target is formed by a method according to this invention, i.e. by chemical vapor deposition, it is not absolutely necessary to form a recess in the end surface of the anode base. This is because the anode target may be formed by depositing an anode target material over an entire leveled end surface of the anode base. However, according to this invention, a recess is formed in the end surface of the anode base and the anode target is formed in the recess by chemical vapor deposition for the following reasons.

The first reason is that a relatively thick anode target is efficiently formed. That is, an anode target for use in a stationary anode X-ray tube needs to be formed thicker than an anode target for use in a revolving anode X-ray tube. For example, a revolving anode target has a thickness on the order of 200 to 300 μm, whereas a stationary anode target has a thickness of approximately 0.5 to 3 mm. The position (focal point) of the revolving anode target struck by thermions released from the cathode is shiftable with revolution of the target. With the stationary anode target, this focal point does not shift so that the target itself must have a large heat capacity. For this reason, a stationary anode target of increased thickness is desired. It would be time-consuming and greatly impair manufacturing efficiency if a thick target is formed by depositing the anode target material by chemical vapor deposition on a flat end surface of the anode base. To secure a high manufacturing efficiency, according to this invention, a recess is formed in the end surface of the anode base for allowing the anode target material to be deposited therein effectively. That is, target material reaction gases supplied during a chemical vapor deposition process tend to remain in the recess formed in the end surface of the anode base. Consequently, the anode target material is deposited at a higher rate in the recess than in other flat regions, thereby forming the anode target in the recess efficiently.

The second reason is to facilitate a machining process after the anode target material is deposited on the end surface of the anode base. When the anode target is formed by chemical vapor deposition in the recess formed in the end surface of the anode base, the anode target material is deposited in a thin layer also in regions of the end surface other than the recess. Such thin target portions could peel off when subjected to a high temperature during use of the X-ray tube or during manufacture thereof, thereby causing malfunctioning of the X-ray tube. It is therefore necessary to scrape off such thin target portions after the anode target material is deposited on the end surface of the anode base. According to this invention, the end surface of the anode base is polished with a polishing machine or the like to remove with ease the anode target material deposited in the regions of the end surface other than the recess. At this time, the anode target proper formed in the recess is not scraped off in an excessive amount.

The third reason is to enhance heat conductivity from the anode target to the anode base. Where the anode target is formed in the recess of the anode base, a large area of contact is secured between the anode target and the anode base to enhance heat conductivity, compared with the case of forming an anode target in elevation on a flat end surface of the anode base.

According to this invention, the recess formed in the end surface of the anode base has an upwardly diverging inner peripheral wall for the following reason.

If the inner peripheral wall of the recess extended perpendicular to the bottom surface or converged so as to overhang the bottom surface, the reaction gases would not flow in sufficient amounts to the corners of the bottom surface of the recess when depositing the anode target material by chemical vapor deposition in the recess. As a result, the anode target material would not be deposited in the corners, tending to leave spaces (gaps) therein. Such gaps present between the anode target and anode base are detrimental to heat conductivity, and could cause cracks in the anode target during use of the X-ray tube, or a concentration of electric fields, thereby lowering withstanding voltage. Further, during the chemical vapor deposition process, the anode target material begins to accumulate in directions perpendicular to the bottom surface and inner peripheral wall of the recess. As the accumulation progresses, the anode target material extends vertically upward. Consequently, where the corners of the bottom surface of the recess have an acute angle, an interference would occur in the vicinity of the corners between portions of the anode target material growing perpendicular to the inner peripheral wall and bottom surface, respectively. This interference tends to cause turbulence in crystallization of the anode target formed adjacent the corners of the bottom surface of the recess. Such turbulence in crystallization results in cracks and peeling of the anode target.

According to this invention, therefore, the inner peripheral wall of the recess is shaped to diverge upward for allowing the anode target to be deposited in the recess. This configuration allows no gaps to be left between the anode target and anode base, whereby the anode target formed has an excellent crystal structure.

Preferably, the upwardly diverging inner peripheral wall has an inclination angle of at least 30 degrees but less than 90 degrees. It is still more advantageous if the inclination angle is in the range of 30 to 70 degrees. If the inclination angle were 90 degrees or larger, the corners of the bottom surface of the recess form an acute or near-acute angle to allow formation of gaps in the corners when the target material is deposited as noted above. If the inclination angle of the inner peripheral wall were less than 30 degrees, the anode target would be formed too thinly adjacent the edges of the recess. Such thin peripheral portions of the target could easily be cracked or peeled off when an intense thermal load is applied thereto, or under a thermal stress due to a difference in thermal expansion coefficient between the anode base (e.g. copper) and a metal of high melting point forming the anode target which occurs during brazing of the glass-sealing covar (i.e. heating to 800° to 850° C.) in the manufacture of the X-ray tube.

It is preferred, according to this invention, that the anode base is formed of copper which has high heat conductivity, and that the anode target material is formed of a metal of high melting point such as tungsten (W), molybdenum (Mo), an alloy of tungsten (W) and molybdenum (Mo), an alloy of tungsten (W) and rhenium (Re).

In another aspect of the invention, a method of manufacturing an anode for use in an X-ray tube is provided which comprises the steps of:

covering, with a masking material, an outer peripheral wall of an anode base with a recess formed in an end surface thereof which recess has an upwardly diverging inner peripheral wall;

depositing an anode target material by chemical vapor deposition directly on the end surface; and shaping the end surface by mechanically polishing the end surface where the anode target material is fixed, to remove the anode target from end surface regions other than the recess.

According to this method, the anode target material is deposited by chemical vapor deposition, with the outer peripheral wall of the anode base covered with a masking material. Thus, the outer peripheral wall of the anode base remains free from adhesion of the anode target material, thereby to lighten the load of the subsequent machining process. After the anode target is deposited on the end surface of the anode base, the end surface is mechanically polished to remove unwanted portions of the anode target material, leaving the anode target formed in the recess.

In the above method, the masking material, preferably, comprises the same metallic material used for forming the anode base. When exposed to a hot atmosphere during chemical vapor deposition of the anode target material, the masking material readily joins the outer peripheral wall of the anode base, leaving small or no gaps therebetween. This is effective to avoid adhesion of the anode target material to the outer peripheral wall of the anode base. Where the anode base is formed of copper, for example, the masking material may advantageously be copper foil.

Preferably, the recess is formed in the end surface before an opposite, proximal end of the anode base is machined, and the proximal end is machined with a surface of an anode target formed in the recess acting as a dimensional reference. According to this method, after the anode target is formed on the end surface of the anode base, the proximal end is machined using the surface of the anode target as a reference. Thus, the length from the target surface to the proximal end may be established with high precision. If the proximal end of the anode base were machined before the anode target material is deposited, variations in the thickness of the anode target formed would affect the precision of the length from the target surface to the proximal end. This dimensional precision is relevant to the precision of a focal position of the X-ray tube into which the anode is incorporated. Therefore, the method according to this invention which provides the dimension from the target surface to the proximal end of the anode base with high precision is of practical advantage.

In a further aspect of the invention, a stationary anode X-ray tube is provided which comprises:

a cathode for releasing thermions;

a stationary anode for generating X rays when irradiated with the thermions; and a vacuum envelope containing the cathode and the anode;

wherein the anode includes an anode base with a recess formed in an end surface thereof and having an upwardly diverging inner peripheral wall, and an anode target formed in the recess by directly fixing therein an anode target material by chemical vapor deposition.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

A preferred embodiment of this invention will be described in detail hereinafter with reference to the drawings.

Figure 1:
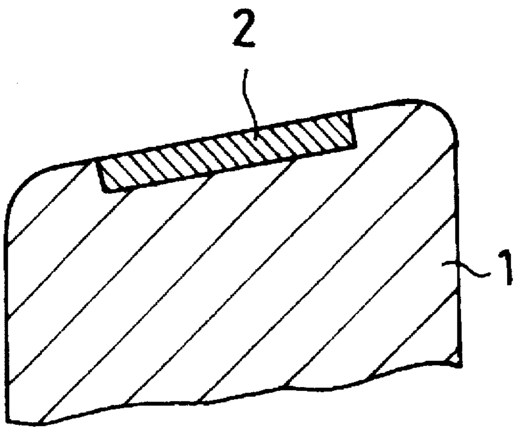
Fig.1 (PRIOR ART)
FIG. 1 is a fragmentary sectional view of an X-ray tube anode manufactured by a conventional casting method.
Figure 2:
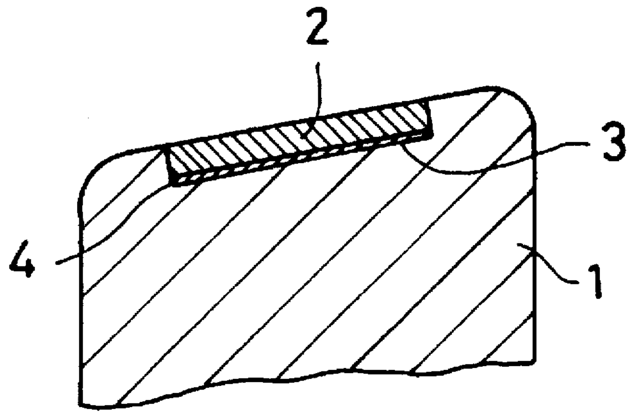
Fig.2 (PRIOR ART)
FIG. 2 is a fragmentary sectional view of an X-ray tube anode manufactured by a conventional brazing method.
Figure 3:
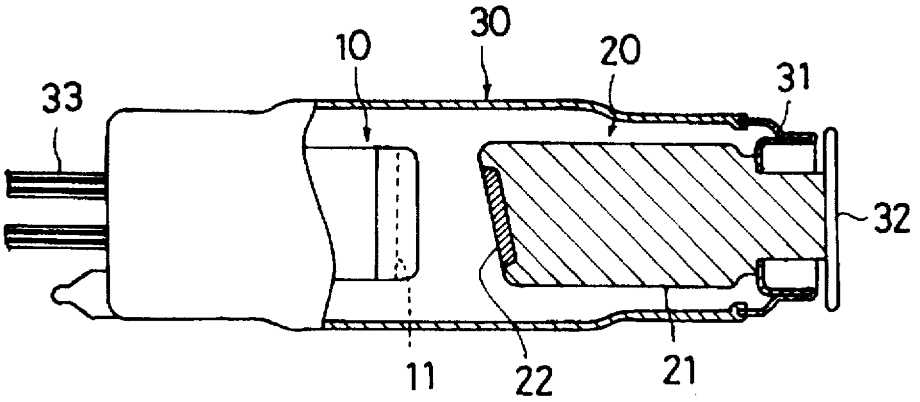
FIG. 3 is a sectional view showing an outline of a stationary anode X-ray tube according to this invention.

Referring to FIG. 3, a stationary anode X-ray tube includes a cathode 10 for releasing thermions, a stationary anode 20 opposed to the cathode 10 for generating X rays when irradiated with the thermions, and a glass vacuum envelope 30 containing the cathode 10 and anode 20. The cathode 10 has a single or a plurality of filaments 11 which release thermions when electrified.

The anode 20, which forms the subject matter of this invention, has an approximately cylindrical anode base 21, and an anode target 22 directly deposited by chemical vapor deposition or CVD to an inclined end surface of the base 21 opposed to the cathode 10. The anode 20 is mounted in sealed condition, at a proximal end thereof remote from the inclined end surface where the target 22 is formed, in the vacuum envelope 30 through a metal element (e.g. covar element) 31 brazed in place. A cooling device 32 is attached to the proximal end of the anode 20. The cathode 10 has a cable 33 connected thereto for supplying power to the filament or filaments 11.

Details of the anode 20 will be described with reference to FIG. 4.

The anode base 21 is formed of a metal having high heat conductivity, such as copper. The anode base 21 defines, in its inclined end surface, a recess 23 which is circular in plan view. The target 22 is directly deposited by a CVD process inside the recess 23. The recess 23 has a depth in the order of 4 mm which substantially corresponds to a thickness of the target 22. The recess has an inner peripheral wall **23*a* which diverges upward. The diverging wall 23*a* has an angle of inclination θ of 30 degrees or larger but less than 90 degrees, preferably in the range of 30 to 70 degrees. As noted hereinbefore, if the angle of inclination θ were 90 degrees or larger, reaction gases supplied when the target 22 is formed by CVD would not flow smoothly to corners of the bottom surface of recess 23. Gaps could thereby be formed in the corners, or turbulence would tend to occur in crystallization of portions of target 22 deposited adjacent the corners of the bottom surface of recess 23. If the angle of inclination θ were less than 30 degrees, peripheral portions of target 22 would be formed too thin. Such thin peripheral portions of target 22** could easily be cracked when an intense thermal load is applied thereto during use of the X-ray tube or when heat is applied at a brazing step in manufacture of the X-ray tube.

Figure 4:
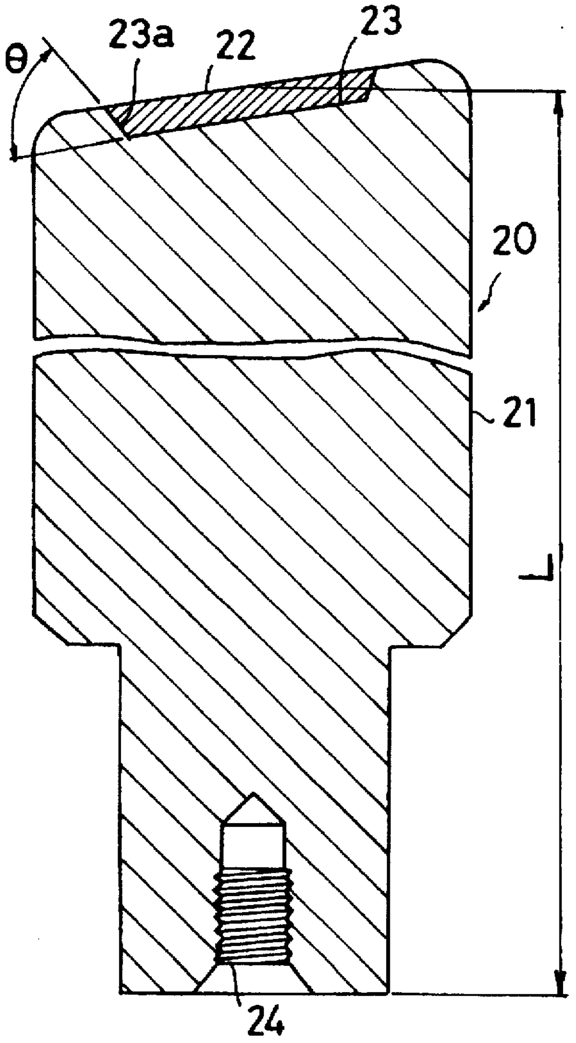
FIG. 4 is a sectional view of an anode for the X-ray tube according to this invention.
Figure 5:
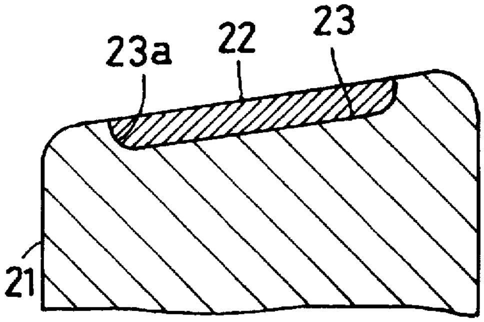
FIG. 5 is a fragmentary sectional view of an anode for an X-ray tube in a different embodiment of the invention.

The diverging inner peripheral wall **23*a* need not define linear inclined surfaces as shown in FIG. 4, but may define, for example, arcuate inclined surfaces 23*a*** as shown in FIG. 5.

A metal of high melting point is used as the material for the anode target 22 formed by CVD. A preferred material is tungsten (W), molybdenum (Mo), an alloy of tungsten (W) and molybdenum (Mo), an alloy of tungsten (W) and rhenium (Re), or an alloy of molybdenum (Mo) and rhenium (Re).

The proximal end of anode base 21, remote from the inclined end surface where the target 22 is formed, defines a threaded hole 24 for connecting the cooling device 32 to the anode base 21 (see FIG. 3).

A method of manufacturing the anode 20 for the stationary anode X-ray tube having the above construction will be described next.

Figure 6A:
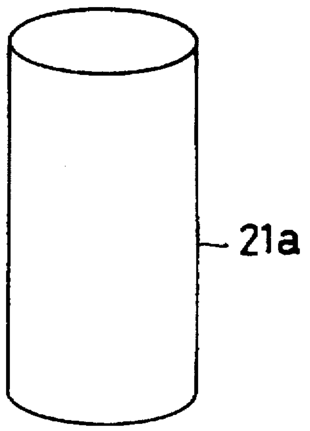
FIGS. 6A through 6F are explanatory views of an anode manufacturing method according to this invention.
Figure 6D:
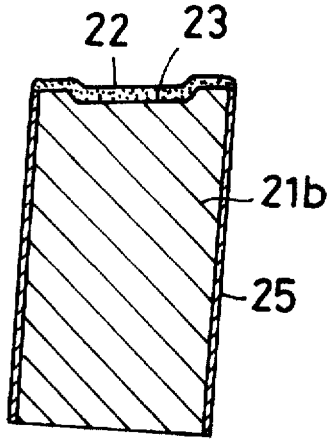
Figure 6B:
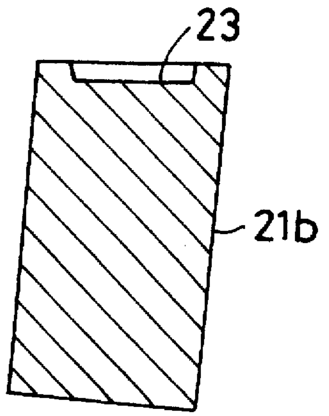

A cylindrical copper blank **21*a* for the anode base 21 as shown in FIG. 6A is machined into a shaped blank 21*b* as shown in FIG. 6B. The shaped blank 21*b* has the inclined end surface and recess 23 of anode base 21, but not the distal end of anode base 21 processed yet. In this example, the inner peripheral wall 23*a* of recess 23** has an inclination angle θ set to 45 degrees.

Figure 6E:
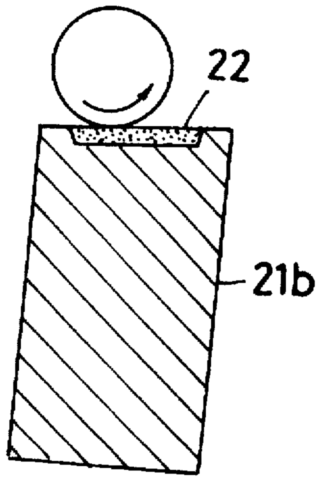
Figure 6C:
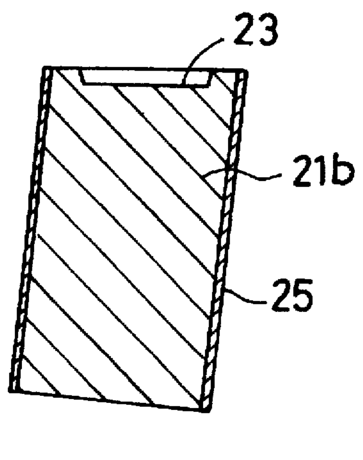

Then, as shown in FIG. 6C, the outer peripheral wall of shaped blank **21*b* is covered with copper foil 25 acting as a masking material. The masking copper foil 25 may be shaped in varied ways according to quantities of production. For a small quantity, copper foil 25 may be shaped with a cutting tool with ease. For a large quantity, copper foil 25 may be press worked with dies. The copper foil 25 is bound with copper wire to be immovable. It is of course possible to clamp and fix the copper foil 25** in peripheral positions thereof with repeatedly usable jigs. However, parts of the target material and copper foil could adhere to the jigs to limit their life. It is advantageous to fix the copper foil with an inexpensive, disposable material such as copper wire.

It is preferable, in this embodiment, that the masking material is the same metal as the anode base 21. However, stainless steel foil or fluororesin sheet may be used instead. Preferably, the copper foil 25 has a thickness of 30 to 100 μm. If the copper foil 25 were less than 30 μm thick, it would be difficult to separate the copper foil 25 from the anode base 21 after the target material is deposited by CVD. If the thickness of copper foil 25 exceeds 100 μm, it would be difficult to wrap the copper foil 25 around the anode base 21 with no gaps therebetween.

Figure 7:
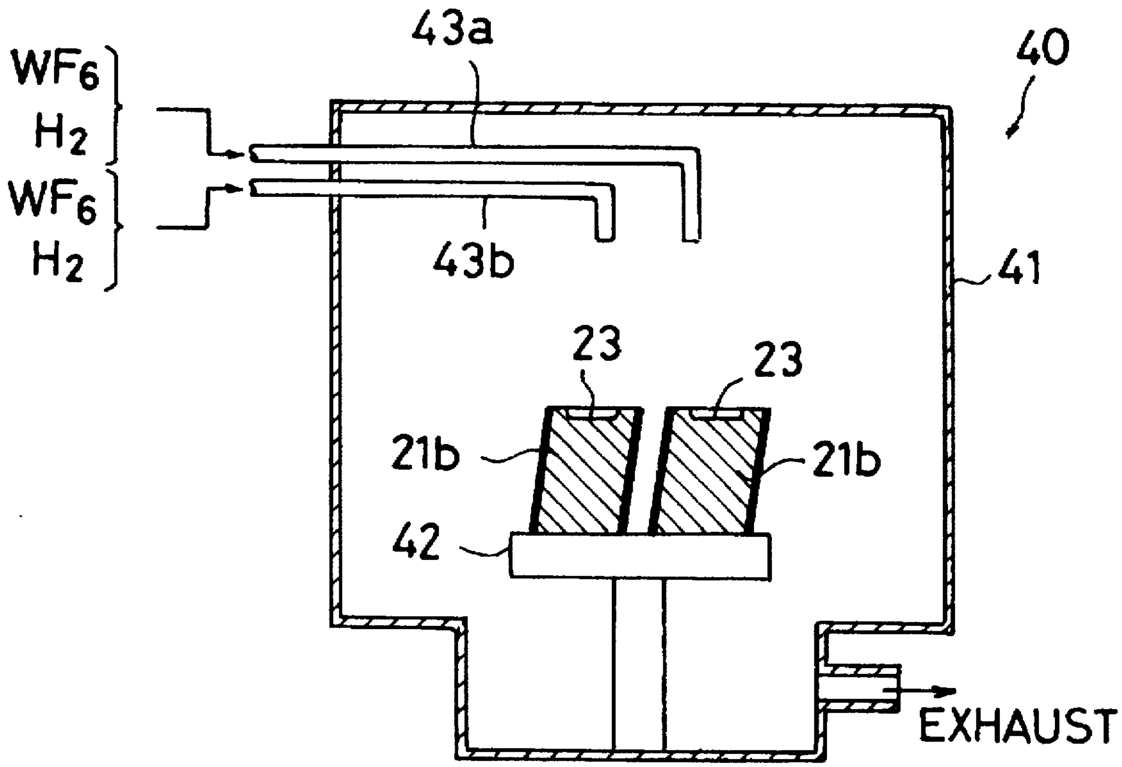
FIG. 7 is an explanatory view of a CVD method employed in this invention.

After the outer peripheral wall of shaped blank 21b is covered with the copper foil 25, the shaped blank 21b is set, as shown in FIG. 7, in a reaction tube 41 of a CVD device. The reaction tube 41 has a heater 42 mounted therein for supporting shaped blanks 21b, and reaction gas supply pipes 43a and 43b extending thereinto. Where the anode target is formed of tungsten, a mixture of tungsten fluoride ($WF_6$) gas and hydrogen ($H_2$) gas is supplied through each of the reaction gas supply pipes 43a and 43b. Thus, tungsten (W) is deposited on the inclined end surface of each shaped blank 21b by reducing tungsten fluoride with hydrogen in a hot atmosphere. The depositing conditions are, for example, that the temperature is 300° to 800° C., tungsten fluoride is supplied at a rate of 100 to 300 cc/min. hydrogen at a rate of 300 to 1000 cc/min. and the total pressure is 0.5 to 760 torr.

Since the recess 23 is formed in the inclined end surface of shaped blank 21b, a tungsten layer (anode target) is deposited more quickly (i.e. thicker) in the recess 23 than in other regions of the inclined end surface. This is considered to be due to the fact that the reaction gases ($WF_6$ and $H_2$) supplied into the reaction tube 41 remain in the recess 23 for a relatively long time. Further, since the inner peripheral wall of recess 23 is inclined (at 45 degrees), the tungsten layer is reliably deposited on the inner peripheral wall of recess 23 as well. The heat of CVD process causes the copper foil 25 covering the outer peripheral surface of anode base 21 to fit tightly on the anode base 21, eliminating gaps therebetween. Consequently, no tungsten layer is formed on the outer peripheral surface of anode base 21. FIG. 6D shows how the tungsten layer (anode target 22) has been deposited on the inclined end surface of shaped blank 21b.

After formation of the tungsten layer, the shaped blank 21b is allowed to cool in the reaction tube 41 of CVD device 40 to a temperature at which the blank 21b may be removed from the reaction tube 41. A tungsten layer is also formed in a certain amount on the copper foil 25 in tight contact with the outer peripheral wall of shaped blank 21b. The difference in thermal expansion coefficient between the tungsten layer and shaped blank (copper) 21b results in a force acting in a direction to separate the copper foil 25 from the shaped blank 21b in the course of cooling after the layer formation. Thus, the copper foil 25 may be separated with facility after cooling. However, if the copper foil 25 is too thin, the foil 25 adheres firmly to the shaped blank 21b and does not readily peel off.

After the copper foil 25 is separated from the outer peripheral wall of shaped blank 21b, the inclined end surface of shaped blank 21b is mechanically polished as shown in FIG. 6E, to remove portions of the tungsten layer deposited in regions of the inclined end surface other than the recess 23. These portions of the tungsten layer are thin and, if left in such regions, would tend to crack or peel off when subjected to a high brazing temperature during the X-ray tube manufacturing process or under the intense thermal load during use of the X-ray tube.

Figure 6F:
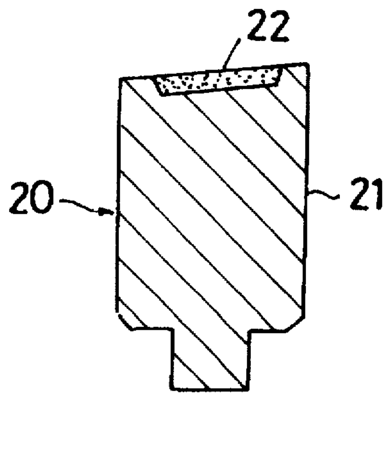

After the inclined end surface of shaped blank 21b is treated, the entirety of anode 20 is completed by machining the proximal end of shaped blank 21b (anode base 21), with the surface of anode target 22 in the recess 23 acting as a dimensional reference (see FIG. 6F). By machining the proximal end of anode base 21 at the final step as noted above, any variations in the thickness of anode target 22 may be accommodated and adjusted. This provides improvement in the precision of length L (FIG. 4) from the surface of target 22 to the proximal end, i.e. the precision of a focal position of the X-ray tube. If the proximal end of anode base 21 were machined before the anode target 22 is formed by CVD, the target 22 of less thickness than a predetermined value would require an additional step of depositing the target material again to secure a standard length from the target surface to the proximal end.

Figure 8A:
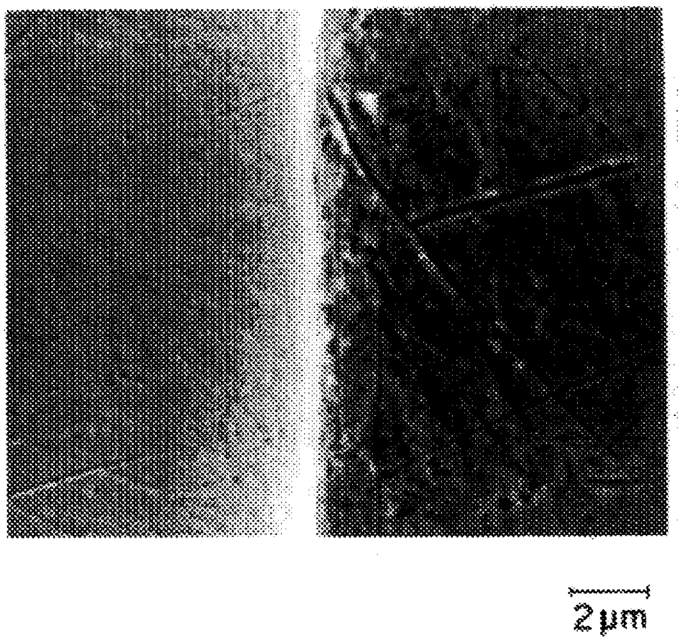
FIG. 8 is a view showing characteristics of a plane of interface between an anode target and an anode base provided by this invention.
Figure 8B:
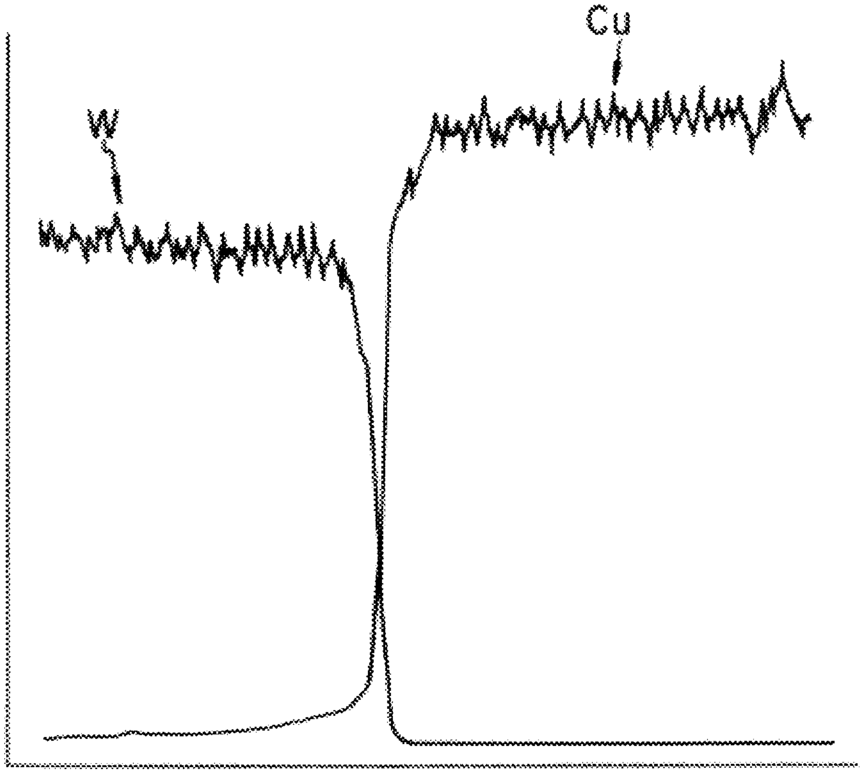

FIG. 8 shows a photograph taken with a scanning electron microscope (SEM) of a plane of interface between tungsten (anode target 22) and copper (anode base 21) obtained by the above method, and results of elemental analysis (EPMA analysis) of the plane of interface. It is seen that the method of this invention provides an excellent joint between tungsten and copper, with no gap in the plane of interface therebetween. Further, no impure elements are found in the plane of interface which would impair heat conductivity and long-term reliability.

To confirm validity of this invention, a test was conducted in which anodes obtained by the above CVD method and those prepared by the known casting method were sealed in X-ray tubes, respectively.

As test conditions, a long input was made (exposure to X rays for one minute) assuming X-ray fluoroscopy, and a comparison was made of maximum load inputs occurring when tungsten in the focal position of anode target 22 began to melt. The following results were obtained from the test:

| | | maximum load input |
|---|---|---|
| (1) | X-ray tube A by CVD: | 70 kV - 6.2 mA (434 W) |
| | X-ray tube B by CVD: | 71 kV - 6.0 mA (426 W) |
| | X-ray tube C by CVD: | 70 kV - 5.8 mA (406 W) |
| (2) | X-ray tube by casting: | 72 kV - 5.0 mA (360 W) |

As seen from the above results, X-ray tubes A, B and C according to this invention showed an average of maximum load inputs at 422 W. This confirms an improvement in maximum load input of about 17% over the conventional X-ray tube. A comparison was made also of short-term maximum rating (condition for X-ray photography) for reference, but no difference was found between the two types of X-ray tubes.

As described above, a stationary anode X-ray tube according to this invention allows increased input for X-ray fluoroscopy to realize a correspondingly improved radiographic image quality. Such a stationary anode X-ray tube may be used also in operations including large-dose fluoroscopy of 660 W and 20 sec. exposure, for example, and simple DSA (Digital Subtraction Angiography) requiring a similar, high output.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of manufacturing an anode for use in a stationary anode X-ray tube, comprising the steps of:

providing a recess, having an upwardly diverging inner peripheral wall in an end surface of an anode base;

covering an outer peripheral wall of said anode base with a masking material;

depositing an anode target material, by chemical vapor deposition, directly on said end surface in said recess; and polishing said end surface, comprising said anode target material to remove anode target material that has been deposited on end surface regions other than said recess.

2. A method as defined in claim 1, wherein said masking material and said anode base comprises the same metallic material.

3. A method as defined in claim 2, wherein said anode base and said masking material are formed of copper.

4. A method as defined in claim 1, further comprising machining a proximal end of said anode base to control the distance of said proximal end from said polished anode target using said polished anode target formed in said recess as a dimensional reference.

* * * * *